3,378,434

FIRE-RESISTANT PAPER-BASE EPOXY RESIN LAMINATES

John A. Harrington, Varnville, S.C., assignor to Westinghouse Electric Corporation, Pittsburgh, Pa., a corporation of Pennsylvania No Drawing. Filed June 18, 1964, Ser. No. 376,245
6 Claims. (Cl. 161—184)

ABSTRACT OF THE DISCLOSURE

Paper-based laminates are impregnated with a resinous composition containing a brominated epoxide, up to an equal amount of a non-halogenated epoxide and a halogenated anhydride. The halogen of the epoxide resin-anhydride combination is from about 20% to about 50%, by weight. Antimony trioxide, flexiblizing agents such as polyesters, tricresyl phosphate and chlorinated biphenyl may also be included. Bonded together into a unitary structure by the cured solid resin, the laminate has high electrical and physical properties together with outstanding fire-resistance.

The present invention relates to electrical grade self-extinguishing paper-base epoxy resin laminates. More particularly, the invention relates to a class of epoxy resin compositions adapted for the production of improved fire resistant paper-base laminates. The invention includes the epoxy resin compositions, electrical grade laminates prepared therewith, and the method of producing the laminates.

Fire-resistant and self-extinguishing reinforced resinous laminates have long been known in the art. Many of the prior art laminates have employed glass fiber or cloth, asbestos, mica, or other inorganic reinforcing materials in conjunction with resinous impregnants as binding agents. In some instances, the resinous binder was one of the epoxy resins in conjunction with one or more halogenated hardeners. While such laminates were fire-resistant or even self-extinguishing, they were deficient in some physical properties such as machinability, punchability at room temperature, and some electrical properties.

It has been recognized that similar paper-base laminates would be highly desirable as regards electrical and physical properties. However, it has been impossible to impart to this class of laminates the requisite fire-resistance, any any appreciable degree of self-extinguishability has heretofore been unattainable.

It is, therefore, a primary object of the invention to provide paper-base resinous laminates characterized by outstanding fire-resistance and self-extinguishing properties.

Another object of the invention resides in the provision of fire-resistant electrical grade paper-base laminates wherein the resinous binder comprises an epoxy resin composition.

A further object of the invention resides in the provision of an opoxy resin system which permits the production of paper-base laminates possessing greatly improved fire-resistance.

Other objects will become apparent from the following detailed description of the invention.

Generically, the invention stems from the discovery that an epoxy resin system in which at least a portion of the opoxide and/or epoxides contains a considerable proportion of bromine imparts to paper-base laminates outstanding fire-resistance. A brominated epoxide is used in conjunction with a halogenated anhydride curing agent and, as well, with flexiblizing agents and inorganic fillers of selected classes. Together, these materials permit attaining in paper-base laminates a degree of fire-resistance and self-extinguishability heretofore unattainable. It is also to be understood that non-halogenated (or standard) epoxy resins are to be employed with the above compositions in desired proportions up to 100% by weight of the brominated epoxy resin.

It has been found that, in the total epoxide resin-anhydride system, from about 20% to about 50% or more, by weight, must consist of halogen in order to obtain the benefits of the invention. In most instances at least one fourth of the epoxy resin composition will contain no halogen. That is to say that about 15% to about 50% of the weight of brominated polyepoxide may consist of bromine, while the remainder of the halogen may be afforded, for example, by the halogenated anhydride.

The epoxy resins contemplated in the invention are those resins resulting from the reaction of at least one polyhydric alcohol and at least one epihalohydrin in an alkaline medium.

Phenols which are suitable for use include those which contain at least two phenolic hydroxyl groups per molecule. Polynuclear phenols which have been found to be particularly suitable include those wherein the phenol nuclei are joined by carbon bridges, such, for example, as 4,5′-dihydroxy-diphenyl-dimethyl methane (referred to hereinafter as bis-phenol A) and 4,4′-dihydroxy-diphenyl-methane.

While it is usual to employ epichlorophydrin as the epihalohydrin in the preparation of polymeric epoxides, homologues thereof as, for example, epibromohydrin may also be used advantageously.

In the preparation of the highly brominated epoxides of the invention, desirably epichlorohydrin is reacted with tetrabromo bis-phenol A. In this reaction the bromine content of the polymer may be regulated to produce the bromine contents above specified.

Resinous polymeric epoxides or glycidyl polyethers suitable for use in accordance with the invention may be prepared by admixing and reacting from 1 to 2 mol proportions of epihalohydrin, preferably epichlorohydrin, with about 1 mol proportion of tetrabromo bis-phenol A in the presence of at least a stoichiometric excess of alkali based on the amount of chlorine present.

The polymeric epoxides may be prepared in either solid or liquid form. The commercially available glycidyl polyethers (epoxides) which are solids are less expensive than the liquid grades, thus the use of the solid material affords a substantial cost savings. The epoxy resin may, however, be used in this invention in either the solid or liquid form. In any event, a solvent such as toluene or one of the ketones is used in an amount sufficient to prepare an impregnating varnish.

The halogenated anhydride curing agents suitable for use in the invention include dichloro maleic, chlorendic, tetrachloro phthalic, and the like. The selected anhydride is used in an amount of about 20%–30% of the weight of epoxy resin. Amounts in excess of about 30% do not contribute additional benefits to the final cured resin system.

The resin-anhydride compositions are generally used in conjunction with up to about 30% by weight of one or more additives which contribute to dielectric properties and to minimizing afterglow properties. Such materials include chlorinated biphenyl or polyphenyl, tricresyl phosphate, antimony trioxide, and the like. The chlorinated biphenyl and polyphenyl contribute fire-resistance and aid in retention of dielectric loss properties of the laminates. Tricresyl phosphate controls the afterglow properties and does not have an unduly adverse effect on electrical properties of the laminates. Other phosphates have had deleterious effects on the electrical properties of electrical grade laminates prepared therewith.

The antimony trioxide is a filler whose function is to assist in flame smothering. This action may be physical or chemical although its precise action is unknown. The amount employed is not critical except to the point of property degradation on the upper side. Other fillers not containing antimony trioxide have not been found to be suitable. In addition, flexibilizing agents may be employed such as saturated polyesters including propylene glycol-adipic acid resins.

In carrying out the invention, the selected paper web is passed through a varnish containing the novel resin impregnant. While any type of paper may be employed, an electrical grade consists of a cotton linter paper impregnated with about 12% by weight of a phenolic resin. The impregnating apparatus may be of any commercial type such as a two zone treater of the dip-squeeze type. Typical treating conditions include a squeeze roll setting of about 0.010 inch, a wet zone temperature of about 270°–300° F., a dry zone temperature of about 310°–330° F., and a paper web speed of about 100–200 inches per minute. Dwell time in the oven is about 3–7 minutes. The resin varnish is usually about 50–70% resin and filler solids. The above treating conditions result in a resin composition content in the treated paper web of about 50% to about 70% by weight based on the paper weight. The impregnated and dried paper is cut to the desired size and stacked to obtain the desired laminate thickness.

In consolidating the stack or stacks, pressures of about 200–2000 p.s.i., and temperatures of about 130° C.–175° C. are employed depending on the press cycle used and the desired density of the laminate. The pressing cycle may vary from a few minutes up to about 75 minutes depending on the laminate thickness and the number of stacks pressed in each press opening. The stacked sheets are loaded in a cold press, consolidated under the above pressing conditions, and unloaded cooled to about 150° F.

The invention will be further particularized by the following examples. It is to be understood that the examples are given solely for the purpose of illustration.

Example I

The following resin varnish was applied to cotton linter paper (containing about 12% of phenolic resin) in a two zone horizontal treater. After being dried, the paper contained about 70% by weight of the impregnant.

| Material: | Parts by weight |
|---|---|
| Brominated epoxy resin (19% Br) | 150 |
| Epichlorohydrin-bisphenoyl A resin | 150 |
| Chlorendic anhydride | 110 |
| Tricresyl phosphate | 33 |
| Chlorinated biphenyl | 33 |
| Saturated polyester resin | 27.75 |
| Antimony trioxide | 55.5 |
| Solvent-toluene to the extent that the impregnating varnish contained 60% solids. | |

The treated and dried paper was cut to size and stacked, eight to the stack. Eight stacks were consolidated in each press opening. Pressing conditions were: 1000 p.s.i.

pressure; temperature 150° C., and pressing cycle 75 minutes. A standard laminate containing no brominated epoxy resin was similarly prepared. The laminates were tested for flammability by the following methods. Test results are given in the tables.

TABLE I.—NEMA LP-7.07

| Laminate: | Burning time (seconds) |
|---|---|
| Standard | 5–10 |
| Brominated | 0–2 |

TABLE II.—IBM TEST METHOD

| Laminate: | |
|---|---|
| Standard | 5–20 |
| Brominated | 0–5 |

TABLE III.—RCA TEST METHOD

| Laminate: | |
|---|---|
| Standard | [1] Consumed |
| Brominated | 8 |

[1] Would not extinguish.

In the above tests, the IBM Test Method applies a flame at about 1700–1900° F. to the sample twice for 10 seconds with a 5 second interval between the two flame applications. The required extinguishing time (after the second application) must not exceed 20 seconds.

The RCA Test requires the application of a Tirrell burner (or equivalent) flame to the sample for 30 seconds. The material must extinguish itself within 15 seconds after removal of the flame.

Example II

The procedure of Example I was repeated with the following impregnating varnish:

| Material: | Parts by weight |
|---|---|
| Brominated epoxy resin (30% Br) | 150 |
| Epichlorohydrin-bis-phenol A resin | 150 |
| Chlorendic anhydride | 110 |
| Chlorinated biphenyl | 66 |
| Saturated polyester (flexiblizer) | 27.75 |
| Antimony trioxide | 55.5 |
| Solvent | Sufficient |

In this example no tricresyl phosphate was employed and the chlorinated biphenyl was doubled. In the laminated article the only noticeable effect was increased afterglow in the burning test.

Example III

The procedure of Example I was repeated with the following impregnating varnish to a varnish content in the paper of about 50%.

| Material: | Parts by weight |
|---|---|
| Brominated epoxy resin (50% Br) | 225 |
| Epichlorohydrin-bisphenol A resin | 75 |
| Chlorendic anhydride | 110 |
| Tricresyl phosphate | 33 |
| Chlorinated biphenyl | 33 |
| Saturated polyester | 27.75 |
| Antimony trioxide | 55.5 |
| Solvent | Sufficient |

In this example the ratio of brominated epoxy to standard epoxy was increased to 3:1. The flammability properties of the consolidated laminate were excellent. A similar laminate containing no bromine failed in all fire resistance tests.

The following table sets forth additional resin varnish formulations in which the amounts of additives were varied. In laminates prepared from these varnishes the properties were all within the limits required. The only noticeable differences were a gradual increase in dielectric loss properties as the chlorinated biphenyl was decreased, an increase in flammability as the antimony trioxide was decreased, and an increase in afterglow as the tricresyl phosphate was decreased.

TABLE IV

| Samples | Parts by Weight | | | | |
|---|---|---|---|---|---|
| | A | B | C | D | E |
| Material: | | | | | |
| Brominated epoxy (19% Br) | 150 | 150 | 150 | 150 | 150 |
| Epichlorohydrin-bisphenol epoxy | 150 | 150 | 150 | 150 | 150 |
| Chlorendic anhydride | 110 | 110 | 110 | 110 | 110 |
| Tricresyl phosphate | 0 | 24.75 | 33.0 | 8.25 | 16.6 |
| Chlorinated biphenyl | 0 | 24.75 | 33.0 | 8.25 | 0 |
| Saturated polyester | 0 | 20.85 | 27.75 | 6.95 | 0 |
| Antimony trioxide | 55.5 | 55.5 | 13.9 | 55.5 | 55.5 |

The above description will be appreciated by those skilled in the art as illustrative of a class of fire-resistant electrical grade paper-base laminates possessing physical properties greatly improved over prior art paper-base laminates. The method of their preparation is simple and may be carried out in conventional apparatus. The novel class of laminates represents a distinct advance over previous paper-base electrical grade laminates and presents to those skilled in the art a means of producing fire-resistant, easily machineable, and punchable laminates.

I claim as my invention:

1. A fire resistant paper-base resinous laminate comprising plural sheets of paper impregnated and bonded together into a unitary structure with about 50–70% of the laminate weight of a solid binder derived from a resin composition containing a brominated bis-phenol-epichlorohydrin epoxide and up to an equal amount by weight of a bis-phenol-epichlorohydrin epoxide, said resin composition including about 20% to about 30% of a halogenated anhydride based on the resin weight, and up to about 20% by weight of antimony trioxide.

2. A fire resistant paper-base resinous laminate as in claim 1, and wherein the halogenated anhydride is chlorendic anhydride.

3. A fire resistant paper-base resinous laminate as in claim 1, and wherein the sheet paper material is an electrical grade cotton linter paper.

4. A fire resistant paper-base resinous laminate as in claim 1 and wherein the composition contains up to about 35% based on the weight of resin of a mixture of a flexiblizing agent, tricresyl phosphate, and chlorinated biphenyl.

5. A fire resistant paper-base resinous laminate as in claim 1, and wherein the combination of said epoxides and said anhydride contains from about 20% to about 50%, by weight, of halogen.

6. A fire resistant paper-base resinous laminate comprising plural sheets of cotton linter paper impregnated and bonded together into a unitary structure with a solid resin derived from a resin composition containing a brominated bis-phenol-epichlorohydrin epoxide and from about 25% up to about an equal amount by weight of a bis-phenol-epichlorohydrin epoxide, said resin composition including from about 20% to about 30% of chlorendic anhydride, said epoxides and said anhydride containing from about 20% to about 50%, by weight, of halogen, up to about 20% by weight of resin of antimony trioxide and up to about 35% by weight of resin of a flexibilizing agent, tricresyl phosphate and chlorinated bisphenyl.

References Cited

UNITED STATES PATENTS

| | | | |
|---|---|---|---|
| 1,955,888 | 4/1934 | Nollau | 161—403 X |
| 2,590,211 | 3/1952 | Rugar | 106—15 |
| 2,833,681 | 5/1958 | Nelson et al. | 161—184 X |
| 3,034,939 | 5/1962 | Newkirk et al. | 161—403 X |
| 3,058,946 | 10/1962 | Nametz | 260—47 X |
| 3,189,513 | 6/1965 | Calderwood et al. | 161—403 X |
| 3,268,619 | 8/1966 | Nametz | 260—47 X |
| 3,294,742 | 12/1966 | Bremmer | 161—184 X |

EARL M. BERGERT, *Primary Examiner.*

HAROLD ANSHER, *Examiner.*